United States Patent [19]

Anazawa

[11] 3,801,881

[45] Apr. 2, 1974

[54] PACKAGED SEMICONDUCTOR DEVICE INCLUDING A HOUSING IN THE FORM OF A RECTANGULAR PARALLELEPIPED AND CERAMIC RECTANGULAR BASE MEMBER

[75] Inventor: Shinzo Anazawa, Tokyo, Japan

[73] Assignee: Nippon Electric Company, Limited, Tokyo, Japan

[22] Filed: Oct. 24, 1972

[21] Appl. No.: 299,855

[52] U.S. Cl....... 317/234 R, 317/234 G, 317/234 H, 174/52 S

[51] Int. Cl............................. H01l 3/00, H01l 5/00

[58] Field of Search............. 317/234, 3, 3.1, 4, 4.1, 317/5.4; 174/52 S, DIG. 3; 29/589

[56] References Cited

UNITED STATES PATENTS

| | | | |
|---|---|---|---|
| 3,340,602 | 9/1967 | Hontz | 317/234 G |
| 3,404,215 | 10/1968 | Burks et al. | 317/234 G |
| 3,405,224 | 10/1968 | Yawata et al. | 317/234 N |
| 3,706,841 | 12/1972 | Moyle et al. | 317/234 E |
| 3,707,655 | 12/1972 | Rudolph et al. | 317/234 N |
| 3,715,635 | 2/1973 | Mitchel et al. | 317/234 G |

FOREIGN PATENTS OR APPLICATIONS

| | | | |
|---|---|---|---|
| 939,966 | 10/1963 | Great Britain | 317/234 G |
| 40,453 | 8/1967 | Japan | 317/234 N |

*Primary Examiner*—Andrew J. James
*Attorney, Agent, or Firm*—Sandoe, Hopgood & Calimafde

[57] ABSTRACT

A packaged semiconductor device comprises a housing having a ceramic base member in the form of a rectangle. The base member includes a ceramic sheet having rectangular regions orthogonally contiguous to one another corresponding to the base member rectangle. A plurality of first conductors and a substantially equal number of second conductors are metallized on the ceramic sheet. Each first conductor has an area at the substantial center of each rectangular region and an arm extending from that area parallel to one of the common diagonals of the region into a contiguous region and substantially bisecting the common boundary of the two contiguous regions. Each second conductor extends parallel to a diagonal traversing the one diagonal by a substantially equal amount into two contiguous regions disposed orthogonal to the first-mentioned two contiguous regions and substantially bisecting the common boundary of the last-mentioned two contiguous regions.

7 Claims, 14 Drawing Figures

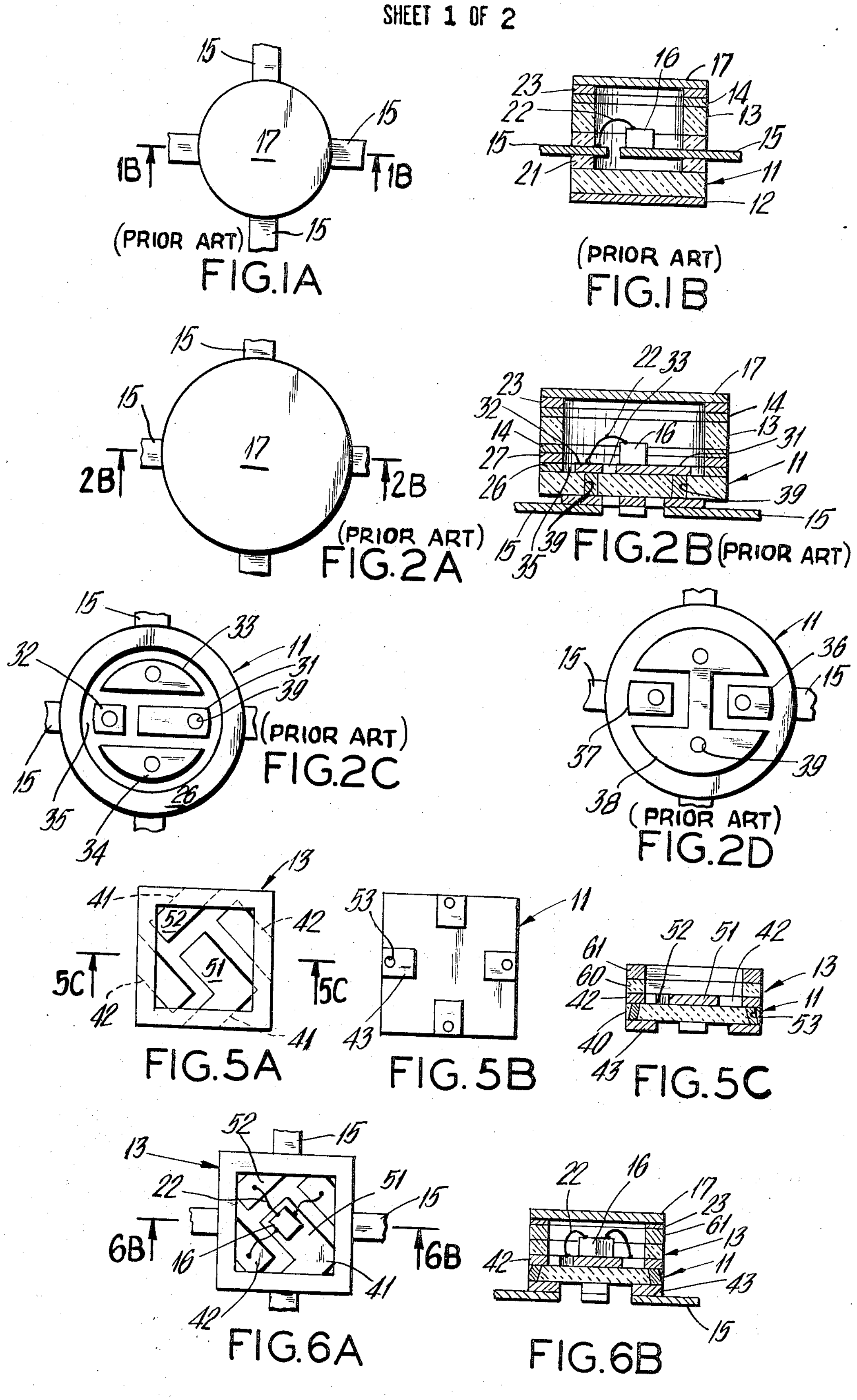
FIG. 1A (PRIOR ART), FIG. 1B (PRIOR ART), FIG. 2A (PRIOR ART), FIG. 2B (PRIOR ART), FIG. 2C (PRIOR ART), FIG. 2D (PRIOR ART), FIG. 5A, FIG. 5B, FIG. 5C, FIG. 6A, FIG. 6B

PACKAGED SEMICONDUCTOR DEVICE INCLUDING A HOUSING IN THE FORM OF A RECTANGULAR PARALLELEPIPED AND CERAMIC RECTANGULAR BASE MEMBER

BACKGROUND OF THE INVENTION

This invention relates to packaged semiconductor devices and, more particularly, to a packaged semiconductor device for use at ultra high frequencies.

It is known that the impedance of the housing of a packaged semiconductor device adversely affects the performance of the device at frequencies of the order of 500 MHz and higher. A conventional housing for a packaged semiconductor device is therefore usually provided with a cylindrical shape to shorten the wiring used to mount the device to a printed circuit board, thereby reducing the undesired impedance. A cylindrical housing, however, has been found objectionable in that it is difficult from the point of view of machining and manufacturing to complete the electric connections within the housing. Moreover, in a cylindrical housing only short leakage paths are provided between adjacent lead wires. The lead wires should be devoid of sharp bends or discontinuities as far as possible so as not to introduce disturbances to the ultra high frequency currents.

SUMMARY OF THE INVENTION

It is therefore an object of the present invention to provide a packaged semiconductor device which has reduced electrostatic capacity and still affords sufficient room for completing the electric connections within the housing.

It is another object of this invention to provide a packaged semiconductor device which is well suited to mass production.

It is still another object of this invention to provide a highly reliable packaged semiconductor device that is especially well suited for use in the ultra high frequency band.

It is a further object of this invention to provide a packaged semiconductor device in which thermal stresses are reduced.

According to this invention a packaged semiconductor device comprises a housing having a ceramic base member in the form of a rectangle. The base member includes a ceramic sheet having rectangular regions orthogonally contiguous to one another corresponding to the base member rectangle. A plurality of first conductors and a substantially equal number of second conductors are metallized on the ceramic sheet. Each first conductor has an area at the substantial center of each rectangular region and an arm extending from that area parallel to one of the common diagonals of the region into a contiguous region and substantially bisecting the common boundary of the two contiguous regions. Each second conductor extends parallel to a diagonal traversing the one diagonal by a substantially equal amount into two contiguous regions disposed orthogonal to the first-mentioned two contiguous regions and substantially bisecting the common boundary of the last-mentioned two contiguous regions.

BRIEF DESCRIPTION OF THE DRAWINGS

FIG. 1A is a top plan view of a conventional packaged semiconductor device;

FIG. 1B is an axial cross-sectional view of the package of FIG. 1A taken along the line 1B—1B of FIG. 1A;

FIG. 2A is a top plan view of another conventional packaged semiconductor device;

FIG. 2B is an axial cross-sectional view thereof taken along the line 2B—2B of FIG. 2A;

FIG. 2C is a top view of a base member used in the packaged device shown in FIGS. 2A and 2B;

FIG. 2D is a bottom view of the base member;

FIG. 5A is a top view of a base and wall assembly for similar use to the base and wall assembly of FIGS, 3 and 4;

FIG. 5B is a bottom view thereof;

FIG. 5C is a vertical cross-sectional view taken along line 5C—5C shown in FIG. 5A;

FIG. 6A is a top view of a packaged semiconductor device according to this invention, with the top member removed; and FIG. 6B is a vertical cross-sectional view of a complete device taken along the line of 6B—6B of FIG. 6A.

DESCRIPTION OF THE PREFERRED EMBODIMENT

Figure 4:
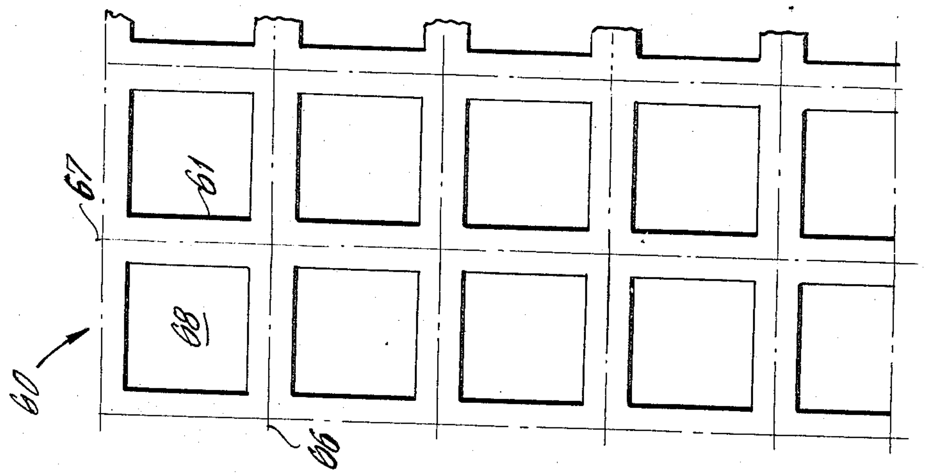
FIG. 4 is a plan view of a wall sheet used in manufacturing a plurality of packaged semiconductor devices in accordance with the present invention.

Referring to FIGS. 1A and B, there is shown a conventional packaged semiconductor device which comprises a disc-shaped base member 11 having a metallized layer 12 formed on the bottom surface thereof for attaching, if desired, the device to either a printed circuit board or a heat sink (not shown). A hollow circular cylindrical peripheral wall member 13 has a metallized ring 14 formed on the top edge thereof, and a plurality of lead wires 15 extend radially from wall member 13. A semiconductor element 16 is mounted on one of the lead wires 15, and a disc-shaped top member 17 is placed over and encloses the wall member. The base member 11 and the wall member 13 are made integral by a mass 21 of fused frit glass together with the lead wires 15. Those electrodes of the semiconductor element 16 which are not in electrical contact with the lead wire 15 on which the element is mounted are electrically connected to the other lead wires 15 by means of fine wires 22. The wall member and the top member 13 and 17 are hermetically sealed together by a mass 23 of a fusible alloy. In the conventional device shown in FIG. 1, the leakage path between adjacent lead wires 15 is provided by a quadrant of the fused frit glass mass 21.

In order for the completed packaged semiconductor device to be small sized, the components thereof must also be small. This creates difficulties in the manufacture and assembly of the components.. For example, it is at the present time difficult to fabricate a wall member 13 having a minimum wall thickness and height of 0.5 mm and 0.3 mm, respectively. The dimensions of the mass of fused frit glass mass 21 poses similar problems. In addition, heating of the frit glass to a higher temperature to prevent the bubbles from remaining in the fused frit glass mass 21 not only deteriorates the semiconductor element 16 but also weakens the mass 21. The fused frit glass mass 21 is furthermore, subject to cracks as a result of the thermal stress remaining therein, as well as the difference in the coefficients of thermal expansion of the components. Because of the padded seal illustrated in FIG. 1B, it is necessary to use a sufficient quantity of the frit glass to insure sufficient strength for rendering the base and the wall members integral. A large number of the components and a variety of the combinations of the components make it difficult to analyse the inherently unavoidable difficulties that may arise in the device of FIG. 1. It has consequently heretofore been difficult to provide highly reliable packaged semiconductor devices at a reduced cost and with an excellent mass producibility.

Referring to FIGS. 2A–2D, there is shown another conventional packaged semiconductor device which comprises components similar to those used in the prior art device illustrated in FIGS. 1A and 1B and which are designated by corresponding reference numerals. The wall member 13 of the FIG. 2 device is, however, provided with a pair of metallized rings on both of its edges. To this end, the base member 11 is metallized along the periphery as shown at 26 in FIG. 2C on one of its principal surfaces. The base and the wall members 11 and 13 are made integral by means of a mass 27 of a fusible alloy rather than by the fused frit glass mass 21. Furthermore, the lead wires 15 in the device of FIG. 2 comprise a metallized pattern formed on the metallized surface of the base member 11 in the manner best illustrated in FIG. 2C at lead wires 31, 32, 33 and 34. The semiconductor element 16 is mounted on one of the metallized inner lead wires 31 that extends from the center of the base member 11 by a small distance 35 to the metallized periphery 26 of the base member. The lead wires 15 further comprise another metallized pattern formed on the other surface of the base member 11 in the manner best shown in FIG. 2D at 36, 37 and 38 in correspondence with the metallized inner lead wires 31 through 34. The corresponding inner and outer lead wires 31 through 34 and 36 through 38 are connected together by through holes 39.

The fusible metal mass 27 applied between the metallized portions 26 and 14 of the base and the wall members improves the reliability of the hermetic seal. The space for completing the electric connections by the fine wires 22, however, becomes smaller than that available in the prior art device described in FIGS. 1A and B, because an appreciable distance 35 is required between the metallized periphery 26 and the inner lead wires 31 through 34. In addition, the discontinuity provided by the through holes 39 causes a reflection of the electrode currents which adversely affects the electrical characteristics of the packaged semiconductor device. Furthermore, it is difficult with the packaged semiconductor device illustrated in FIGS. 2A through D to metallize the inner and the outer lead wire patterns 31 through 34 and 36 through 38 in respective registry with one another with the result that deviations occur in the electrode capacity of the device. This conventional device also requires a large number of components with the resulting defects already explained in conjunction with the previously described prior art example.

Figure 3B:
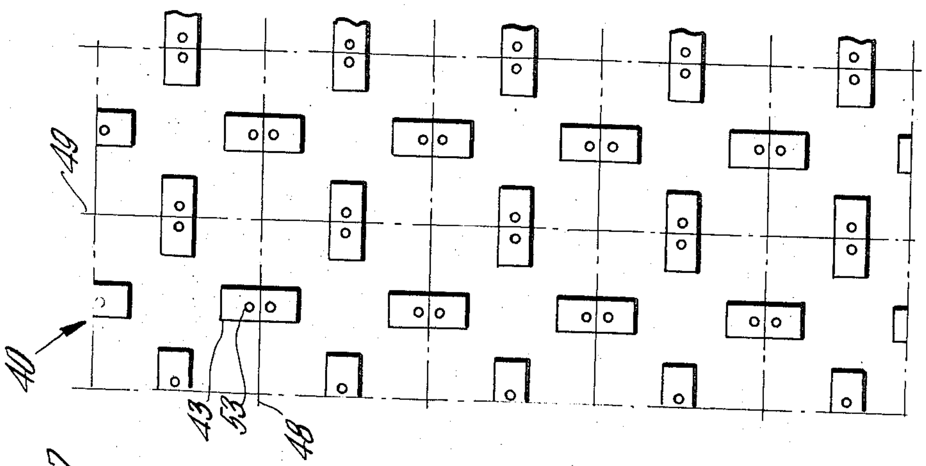
FIG. 3B is a bottom view of the base sheet illustrated in FIG. 3A.
Figure 3A:
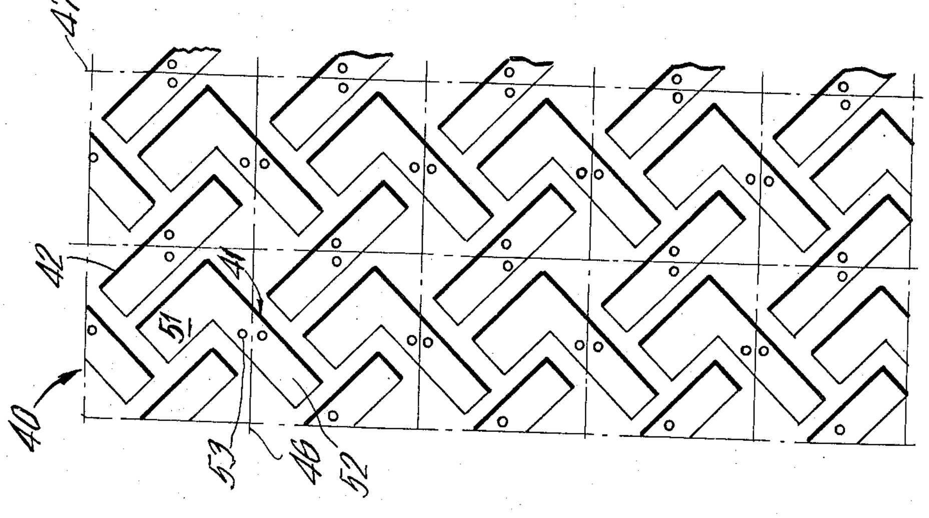
FIG. 3A is a top view of a base sheet used in manufacturing a plurality of packaged semiconductor devices in accordance with the present invention.

Referring now to FIGS. 3A and 3B, there is shown a base sheet from which a plurality of square base members 11 depicted in FIGS. 5 and 6 are obtained in the manner described in a later portion of the specification. That base sheet comprises a first unsintered ceramic sheet 40 on which a plurality of first conductors 41, and a substantially equal number of second conductors 42 are arranged on one surface (FIG. 3A). A plurality of third conductors 43, substantially twice as many as the first conductors 41, are arranged on the opposite surface of sheet 40 (FIG. 3B). The ceramic sheet 40 may be made from a green tape, commercially available, which is a composite tape manufactured by applying a suspension of unsintered ceramic powder in a binder on one flat surface of a polyester film such as a film known, for example, by a trade name "Mylar," in a predetermined thickness of from 0.1 mm to 1mm, and by removing the polyester film. Conductors 41 through 43 are printed or otherwise formed on the principal surfaces of the ceramic sheet 40 with reference to first and second imaginary orthogonal lines 46 and 47 on one surface, and imaginary orthogonal lines 48 and 49 on the other surface along which the base sheet is subsequently divided into the square base members 11. If a printing technique is employed to form the conductors, the ink used may be a paste of metal powder, such as molybdenum or tungsten powder. Each of the first conductors 41 comprises an area 51 formed at the substantial center of a first square region enclosed by a pair of imaginary lines 46 and a pair of imaginary lines 47, and an arm 52 that extends from the central area 51 into a second similar square region having one of the imaginary lines 46 in common with the first square region to the adjacency of that central area of the adjacent one of the first conductors 41 in which the second square region lies. Each of the first conductors 41 substantially bisects the common side of the contiguous square regions which is provided by one of the imaginary lines 46, preferably at a small predetermined angle. Each of the second conductors 42 is formed on the same principal surface as conductors 41 in the form of an elongated rectangle extending by an equal amount into a first square region and a third square region having a common side provided by one of the imaginary lines 47 and substantially bisects the common side at the predetermined angle. Each of the third conductors 43 is formed on the other principal surface of the ceramic sheet 40 and is of the form of an elongated rectangle extending by an equal amount into two contiguous square regions having a common side provided by either of the imaginary lines 48 and 49 and substantially perpendicularly bisecting the common side. Connections between each of the first and the second conductors 41 and 42 and the corresponding one of the third conductors 43 may be provided by a through hole 53. The base ceramic sheet 40 may be provided with scratches in the bottom surface along the imaginary lines 48 and 49 for a purpose which will become clear in a later portion of the specification.

Referring to FIG. 4, a wall sheet from which a plurality of hollow square wall members 13 illustrated in FIGS. 5 and 6 are obtained in the manner to be later described comprises a second unsintered ceramic sheet 60, made in a manner similar to that described in connection with the unsintered ceramic sheet 40, A layer of metal laths 61 is formed on one principal surface of sheet 60 by applying molybdenum or tungsten paste, or by printing or otherwise, along those first and second orthogonal imaginary lines 66 and 67 which are congruent with the first and the second imaginary lines 46 and 47 or 48 and 49 of the ceramic sheet 40. After the metal paste is dried on sheet 60, the sheet is provided, as by punching, with a plurality of square holes 68 therethrough at the portions uncovered by the layer of the metal laths 61.

The assembly of the wall and base members of the packaged semiconductor device of the invention is illustrated in FIGS. 5A, B and C. As therein shown, the first and second unsintered ceramic sheets 40 and 60 with the metal patterns 41 through 43 and 61 formed thereon are superposed one on the other with the imaginary lines 46–47 and 66–67 in registry and with the third conductors 43 and the metal laths 61 outwardly directed. The sheets 40 and 60 are then sintered together at a temperature of between 1,600° C and 1,700° C. The base and the wall sheets thus become an integral ceramic body. At the same time, the metal patterns 41 through 43 and 61 are baked to the ceramic body. Subsequently, the ceramic body is either snapped along the scratches mentioned above or cut along the first and the second imaginary lines into individual assemblies of the base and the wall members 11 and 13, one of which is illustrated in FIGS. 5A, through C.

Referring to FIGS. 6A and B, there is shown a completed packaged semiconductor device according to this invention which comprises an integral ceramic body comprising the base and the wall members 11 and 13. A plurality of conductors is soldered to the respective ones of the third conductors 43 and a nickel or gold layer (not shown) may be plated on the conductors 41 and 42 in the manner known in the art. A semiconductor element 16 mounted on the central area 51 of the first conductor 41 and fine gold or other wires 22 electrically connect those electrodes of the semiconductor element 16 to the arm 52 of the first conductor 41 and to the strips of the second conductor 42 which are not in electric contact with the central area 51. A top member 17 is placed over wall member 13 and a mass 23 of a fusible metal is applied between the top member 17 and the metal lath 61.

In the square cylindrical structure of the packaged semiconductor devices according to the present invention, it is easy to separate the sintered base and wall sheets into the individual assemblies as is desirable in mass production, and it is feasible to provide sufficient space to mount the semiconductor element 16 and to complete the electric connections afforded by the fine wires 22 with the minimum dimensions of the devices. In addition, the leakage path between the adjacent lead wires is longer than that provided by a conventional device of equal diameter. This appreciably increases the reliability of the packaged semiconductor device of this invention in cooperation with the sintering together of the base and the wall sheets instead of using the fused frit glass mass 21. In addition, a packaged semiconductor device according to this invention has electrostatic capacity which is approximately equal to a conventional one of equal diameter, and can be attached to a printed circuit board with an equal length of the conductors as with a conventional device. Moreover, the thoroughly integral assembly of the base and the wall members 11 and 13 and the reduced variety of the materials used in the fabrication of the device of the invention make it easy to improve the mechanical strength of the device and to set the check points for quality control.

While the present invention has been described with respect to a preferred embodiment thereof, it will be easy for those skilled in the art to modify the embodiment in various manners. For example, the metal laths 61 formed on the second unsintered ceramic sheet 60 may have a plurality of circular uncovered portions rather than the square portions to improve airtightness. The metal paste used in printing the unbaked conductors 41, 42 and 43 may be made by mixing metal particles of a diameter of from 0.1 micron to 4 microns, a binder, such as a mixture of nitrocellulose and amyl acetate, and a thinner. The first conductor arms 52, the second conductors 42, and the third conductors 43 may be about 0.5 mm wide and from 8 microns to 20 microns thick. The thickness of these conductors may be 10 microns, for example. The small angle formed between a first conductor arm 52 or a second conductor 42 and the associated first or second imaginary line 46 or 47 may be 45°. The metallized patterns may be dried at a temperature of between 120° C and 130° C for about 30 minutes. Before sintering, it is preferable to pass the superposed base and wall sheets between rollers under a pressure of between 0.5 ton and several tons per square centimeter. The dimensions of a complete semi-conductor packaged device according to the present invention are dependent on the dimensions of the semiconductor element 16. The wall member 13 may be as thin as 0.2mm and the length for bonding the fine wires 22 to the semiconductor element 16 and the inner conductors 41 and 42 may be 0.3mm. It is therefore easy according to this invention to manufacture a packaged semiconductor device whose base member 11 is of 1.4 mm square, on a mass production scale.

In the embodiment shown, the base member and wall member are each shown as being square in cross-section, a rectangular cross-section could also be employed to similar advantage. The term "rectangle" as employed in the following claims is intended to include both rectangles and squares.

I claim:

1. In a packaged semiconductor device comprising a housing for a semiconductor element, said housing being in the form of a hollow rectangular parallelepiped and including a sheet-like base member made of a ceramic material which is in the shape of a rectangle, the improvement which comprises: a plurality of conductors metallized on said base member, each of said plurality of conductors substantially bisecting an edge of said rectangle and extending from the point of substantial bisection of said edge to the inside of said housing substantially parallel to one of the diagonals of said rectangle without extending outside of an ellipse inscribed within said rectangle except for a portion of each of said conductors including the point of substantial bisection.

2. The packaged semiconductor device as claimed in claim 1, wherein said rectangle is a square.

3. The packaged semiconductor device as claimed in claim 1, wherein said plurality of conductors comprise a first conductor and at least one second conductor, said second conductor extending from the point of substantial bisection parallel to one of said diagonals by a predetermined amount past the other of said diagonals, said first first conductor having an area at the substantial center of said rectangle and an arm extending from said area along one of said diagonals and parallel to the other of said diagonals to the point of substantial bisection, said semiconductor element being placed on said area.

4. The packaged semiconductor device as claimed in claim 3, wherein said housing further comprises a plurality of third conductors metallized on the surface of said base member different from the surface on which said first and second conductors are metallized, each of said third conductors substantially bisecting an edge of said rectangle and extending perpendicular to said edge towards the center of said rectangle, said third conductors being electrically connected to said first and second conductors, respectively, at portions thereof adjacent to the points of substantial bisection through said base member.

5. A sheet-like member made of ceramic material and having conducting means metallized on one principal surface thereof for use in making the packaged semiconductor device claimed in claim 3, in which said conducting means comprise said first and second conductors formed on said one principal surface with reference to first and second orthogonally intersecting imaginary lines defining a plurality of substantially congruent square regions on said one principle surface, each of said first conductors comprising an area at the substantial center of a first of said square regions and an arm extending from said area substantially parallel to one of the diagonals of said first square region into a second of said square regions having one of said first imaginary lines in common with said first square region, said arm intersecting said one first imaginary line at the substantial center of that side of said first square region provided by said one first imaginary line, each of said second conductors extending parallel to the other of said diagonals a substantially equal amount into said first square region and into a third of said square regions having one of said second imaginary lines in common with said first square region, each of said second conductors intersecting said one second imaginary line at the substantial center of that side of said first square region provided by said one second imaginary line.

6. The sheet-like member as claimed in claim 5, in which said insulator member is an unsintered ceramic sheet.

7. The sheet-like member as claimed in claim 5, in which said conducting means comprise third conductors formed on the other of said principal surfaces with reference to the orthogonal projections of said first and said second imaginary lines on said other principal surface, each of said third conductors extending a substantially equal amount into contiguous ones of the square regions defined by said orthogonal projections, each of said third conductors intersecting the orthogonal projection separating said contiguous square regions substantially at right angles.

* * * * *